(12) United States Patent
Wu

(10) Patent No.: US 6,295,003 B1
(45) Date of Patent: Sep. 25, 2001

(54) SOCKET HAVING AN OVERLOAD INDICATING AND WARNING DEVICE

(76) Inventor: Hsien Chung Wu, No. 11, Avenue 2, Lane 67, Gi Fong Load, Wu Fong Hsiang, Taichung Hsien (TW), 413

( * ) Notice: Subject to any disclaimer, the term of this patent is extended or adjusted under 35 U.S.C. 154(b) by 0 days.

(21) Appl. No.: 09/564,945

(22) Filed: May 5, 2000

(51) Int. Cl.[7] .................................................. G08B 21/00
(52) U.S. Cl. ........................ 340/664; 340/584; 340/656; 337/1
(58) Field of Search ..................................... 340/664, 595, 340/584, 636, 635, 656; 337/1; 363/146; 324/508, 510; 335/18, 202

(56) References Cited

U.S. PATENT DOCUMENTS

| | | | |
|---|---|---|---|
| 4,352,058 | * | 9/1982 | Westra .................................... 324/51 |
| 4,875,152 | * | 10/1989 | Foster .................................... 363/146 |
| 5,600,306 | * | 2/1997 | Ichikawa et al. ..................... 340/584 |
| 5,650,771 | * | 7/1997 | Lee ........................................ 340/656 |
| 5,990,769 | * | 11/1999 | Tam ....................................... 335/18 |
| 6,157,311 | * | 12/2000 | Berkovich ............................ 340/688 |

* cited by examiner

*Primary Examiner*—Edward Lefkowitz
*Assistant Examiner*—Davetta W. Goins
(74) *Attorney, Agent, or Firm*—Charles E. Baxley

(57) ABSTRACT

A socket has one or more socket members received in an enclosure, and a current indicator disposed in coupled to the socket members for indicating the current through the socket members and for indicating the overload of the socket. The current indicator includes a coil, and a rotatable indicator to be actuated by the coil to indicate the current of the socket. A device may detect the temperature of the socket and a device may generate a warning signal when the socket is overload. The indicator may shield a photoresistive member when the socket is overload.

10 Claims, 4 Drawing Sheets

SOCKET HAVING AN OVERLOAD INDICATING AND WARNING DEVICE

BACKGROUND OF THE INVENTION

1. Field of the Invention

The present invention relates to a socket, and more particularly to a socket having an overload indicating and warning device.

2. Description of the Prior Art

Typical electrical facilities each comprises a plug for plugging into the typical sockets which are coupled to the electric power supply for supplying the electric power to the electrical facilities. The sockets may be burned and damaged when the electric power flowing through the plug and the socket is overload. The typical sockets have no overload indicating and warning device for indicating the overload of the electric power through the socket and for warning the users when the electric power through the socket is overload. Serious hazards, particularly the fires, may be generated when the sockets are overload or when the sockets are over-heated.

The present invention has arisen to mitigate and/or obviate the afore-described disadvantages of the conventional sockets.

SUMMARY OF THE INVENTION

The primary objective of the present invention is to provide a socket including an overload indicating and warning device for indicating the overload of the electric power through the socket and for warning the users when the electric power through the socket is overload.

In accordance with one aspect of the invention, there is provided a socket comprising an enclosure, at least one socket member received in the enclosure, and a current indicator disposed in the enclosure and coupled to the socket member for indicating an electric current through the socket member. The current indicator may indicate whether the socket member is overload or not such that the user may turned off the electric power when the socket is overload and such that the serious hazards may be avoided.

The enclosure includes a first housing and a second housing secured together, the second housing includes at least one opening formed therein for receiving the socket member. The current indicator includes a graduation, a coil, a bar straddled over the coil, an indicator rotatably secured to the bar at a pivot axle and actuated by the coil to indicate the graduation of the current indicator or to indicate the current through the socket.

A device may further be provided for detecting a temperature of the socket and includes a current limiting device having a heat detecting device for detecting the temperature of the socket. Another device is further provided for generating a warning signal and includes a buzzer for generating a warning sound, or includes an indicating light for generating a warning light.

The socket further includes a photoresistive member, and a device is provided for shielding the photoresistive member. The current indicator includes an indicator rotatably secured in the enclosure for indicating a current through the socket, the shielding device includes a shield attached to the indicator for shielding the photoresistive member. The warning signal generating device may generate a warning signal, such as a warning sound or a warning light, when the photoresistive member is blocked or shielded and when the socket is overload.

Further objectives and advantages of the present invention will become apparent from a careful reading of a detailed description provided hereinbelow, with appropriate reference to accompanying drawings.

DETAILED DESCRIPTION OF THE PREFERRED EMBODIMENT

Figure 1:
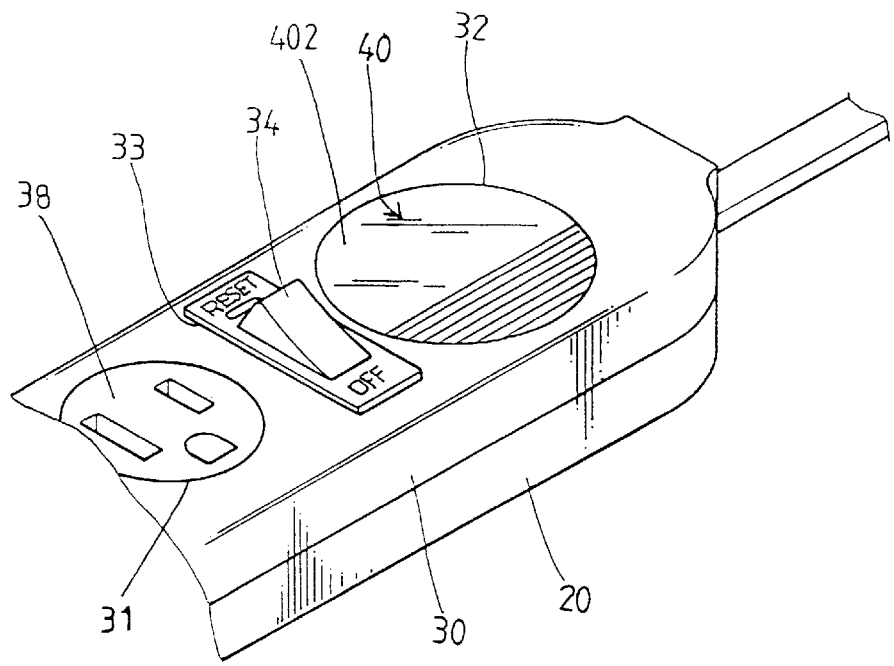
FIG. 1 is a partial perspective view of a socket in accordance with the present invention.
Figure 2:
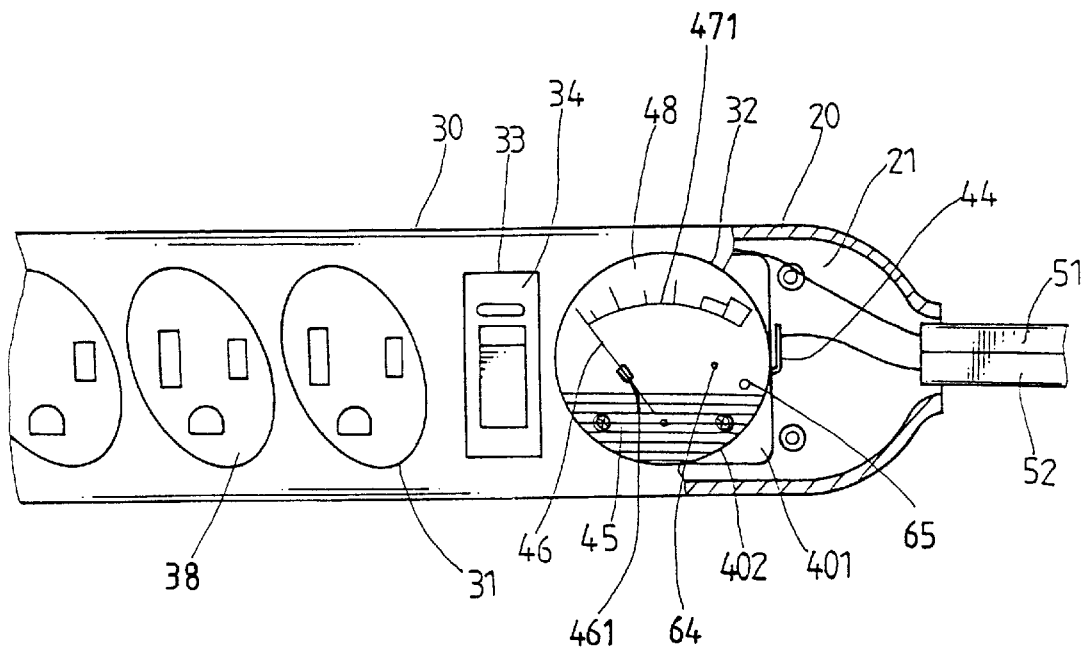
FIG. 2 is a partial top view of the socket, in which a portion of the socket has been cut off for showing the inner structure of the socket.
Figure 3:
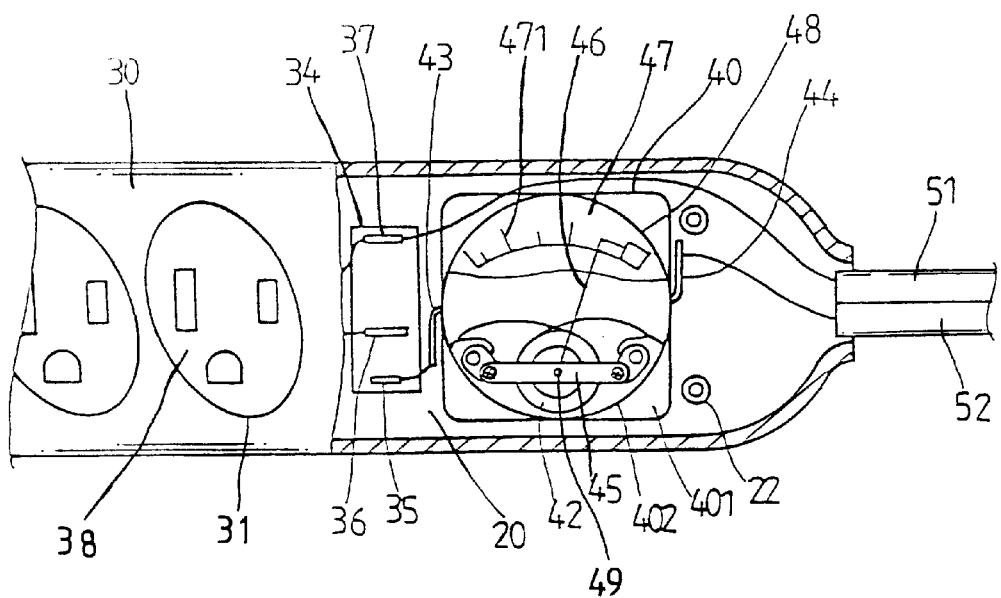
FIG. 3 is a partial top view of the socket similar to FIG. 2, in which a portion of the socket and a portion of the current indicator have both been cut off for showing the inner structures of the socket and of the current indicator.

Referring to the drawings, and initially to FIGS. 1–5, a socket in accordance with the present invention comprises an enclosure including a first housing 20, such as a lower housing 20, and a second housing 30, such as an upper housing 30, secured together with fasteners 22 (FIG. 3) or the like. The second housing 30 includes one or more openings 31 formed therein for receiving the respective socket members 38 therein, and includes an orifice 32 formed therein for receiving a circular casing 402 of a current indicator 40, and includes an aperture 33 formed therein for receiving a switch 34 therein. The switch 34 includes three terminals 35, 36, 37 attached thereto and extended inward of the housings 20, 30 (FIGS. 3, 6 and 7).

The current indicator 40 includes a base 41 received in an inner chamber 21 of the lower housing 20 (FIG. 5) and includes a square or a rectangular casing 401 received in the upper housing 30 and engaged with the housing 30, such that the current indicator 40 may be solidly retained in the housings 20, 30. As best shown in FIG. 3, the current indicator 40 includes a dial 47 having a graduation 471 provided therein, and includes a coil 42 received therein. A bar 45 is secured in the current indicator 40 and straddled over the coil 42. An indicator 46 is rotatably secured to the bar 45 at a pivot axle 49 and rotatable about the pivot axle 49 when an electric current flows through the coil 42, in order to indicate the electric current. The current indicator 40 includes a transparent face panel 48 for allowing the indicator 46 and the graduation 471 to be seen by the users. The coil 42 includes two ends coupled to two conductors 43, 44 respectively which are provided on the opposite sides of the current indicator 40 and which are extended toward the different directions (FIGS. 3, 6, 7), such that the conductors 43, 44 are far away and separated from each other and will not be easily shorted.

Figure 4:
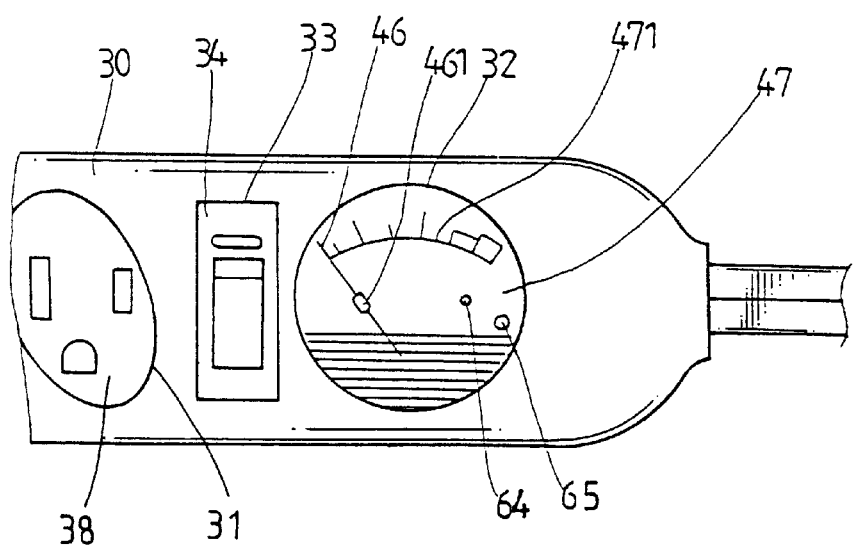
FIG. 4 is a partial top view of the socket similar to FIG. 2, in which the socket has not been cut off.
Figure 5:
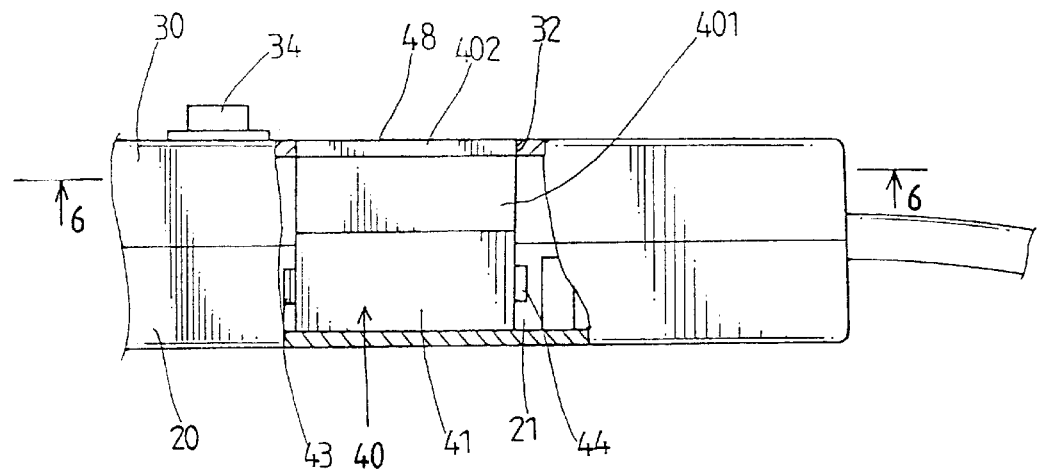
FIG. 5 is a partial side view of the socket, in which a portion of the socket has been cut off for showing the inner structure of the socket.

The socket in accordance with the present invention may be coupled to the electric power source with electric wires 51, 52, for example. The electric wire 51 is electrically coupled to the terminal 37 of the switch 34, and the other electric wire 52 is coupled to the conductor 44 of the current indicator 40. The other conductor 43 of the current indicator 40 is coupled to the terminal 35 of the switch 34. The other terminal 36 of the switch 34 is coupled to the conductors 24 (FIG. 6) of the socket members 38. The typical plugs may engage through the socket holes of the socket members 38 and may then be engaged with the conductors 24. The socket may further include a photoresistive member 64 and an indicating light bulb 65 provided in the current indicator 40 (FIGS. 2, 4). The indicator 46 may include a shield 461 (FIGS. 2, 4) provided thereon for shielding the photoresistive member 64 and for actuating the indicating light bulb 65 or the like.

Figure 6:
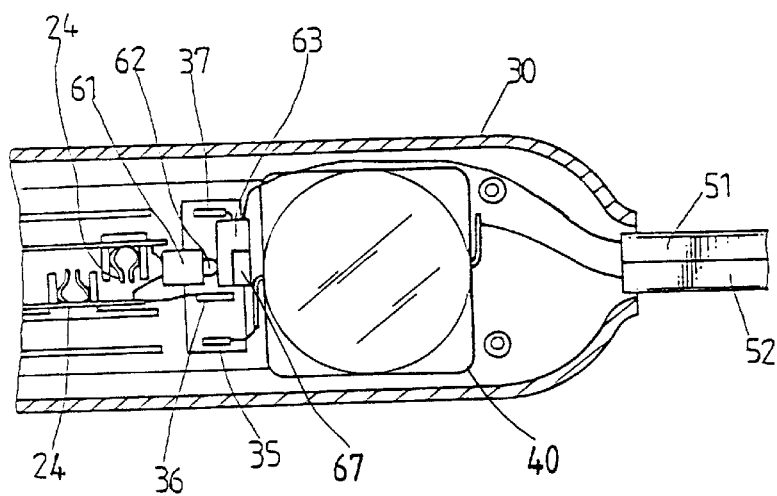
FIG. 6 is a cross sectional view taken along lines 6—6 of FIG. 5.
Figure 7:
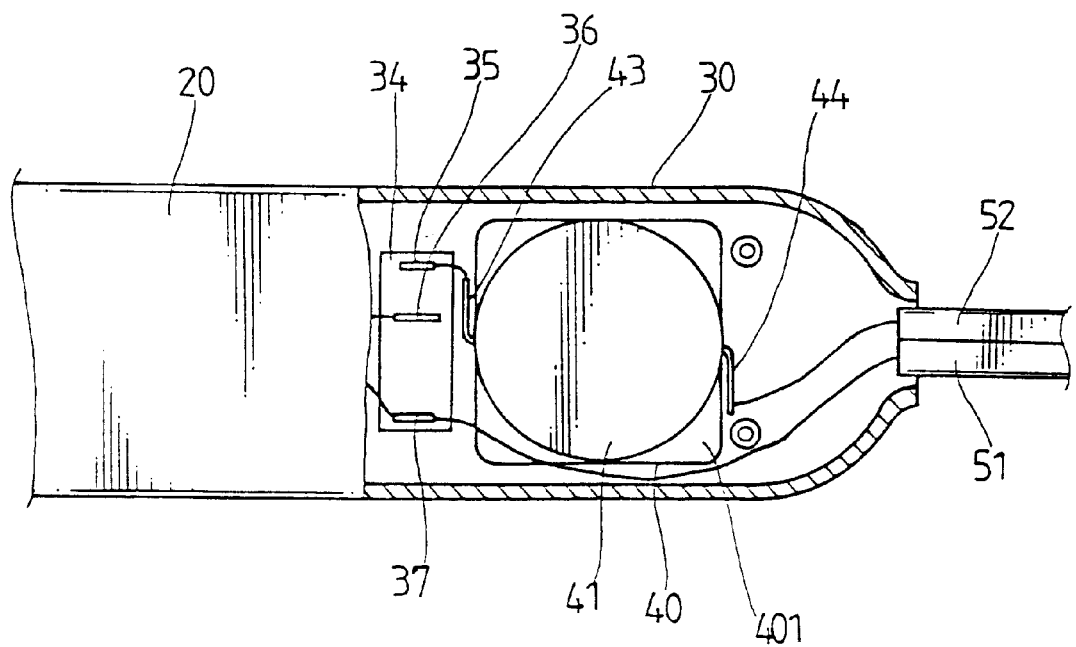
FIG. 7 is a partial bottom view of the socket, in which a portion of the socket has been cut off for showing the inner structure of the socket.

Referring next to FIG. 6, a comparator, such as a voltage comparator 63 is electrically coupled to the electric wire 51 and coupled to the terminal 37 of the switch 34, and includes a buzzer 67 or the like provided therein for generating a warning sound or signal. A current limiting device 61, such as a porcelain member or a heating resistor, is coupled to the conductors 24 and/or to the terminal 36 of the switch 34 and includes a thermo-detector or a heat detecting device 62, which is preferably coupled to the comparator 63.

In operation, as shown in FIG. 3, when an electric power or an electric current flows through the electric wires 51, 52 and the socket member(s) 38, the indicator 46 may be caused to be rotated about the pivot axle 49 by the flowing of the electric current through the coil 42, such that the user may know the electric current to the socket members 38, and such that the users may easily know that the electric current to the socket members is overload or not. It is to be noted that the typical sockets have no current indicators provided therein such that the users may not know the electric current through the sockets, and such that the users may not know whether the sockets are overload or not.

In addition, when the heat detecting device 62 detects that the temperature of the current limiting device 61 is increased, the warning signals generating device 67 of the comparator 63 and the indicating light bulb 65 may be actuated or energized to generate a warning signal, such as the warning sound, the warning light, or the flash lights, such that the users may also easily know the overload of the electric power through the socket members 38.

As best shown in FIGS. 2 and 4, when the electric power through the socket members 38 is overload, the indicator 46 may be rotated to the rightmost position where the shield 461 of the indicator 46 may shield the photoresistive member 64. When the photoresistive member 64 is shielded, the indicating light bulb 65 or the buzzer 67 may be energized and actuated to generate the warning signals.

Accordingly, the socket in accordance with the present invention includes an overload indicating and warning device for indicating the overload of the electric power through the socket and for warning the users when the electric power through the socket is overload. The socket greatly increases the safeness of the use of the electric facilities.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. A socket comprising:

an enclosure, at least one socket member received in said enclosure, and a current indicator disposed in said enclosure and coupled to said at least one socket member for coupling said at least one socket member to a power source and for indicating an electric current through said at least one socket member and for indicating an electric overload of said at least one socket member, said current indicator including a graduation, a coil, a bar straddled over said coil, an indicator rotatably secured to said bar at a pivot axle and actuated by said coil to indicate said graduation of said current indicator.

2. The socket according to claim 1, wherein said enclosure includes a first housing and a second housing secured together, said second housing includes at least one opening formed therein for receiving said at least one socket member.

3. The socket according to claim 1, further comprising means for detecting a temperature of said socket, and means for generating a warning signal.

4. The socket according to claim 3, wherein said temperature detecting means includes a current limiting device having a heat detecting device for detecting the temperature of said socket.

5. The socket according to claim 3, wherein said warning signal generating means includes a buzzer for generating a warning sound.

6. The socket according to claim 3, wherein said warning signal generating means includes an indicating light for generating a warning light.

7. The socket according to claim 1 further comprising a photoresistive member, means for shielding said photoresistive member, and means for generating a warning signal.

8. The socket according to claim 7, wherein said warning signal generating means includes a buzzer for generating a warning sound.

9. The socket according to claim 7, wherein said warning signal generating means includes an indicating light for generating a warning light.

10. The socket according to claim 7, wherein said current indicator includes an indicator rotatably secured in said enclosure for indicating a current through said socket, said shielding means includes a shield attached to said indicator for shielding said photoresistive member.

* * * * *